(12) United States Patent
Moss et al.

(10) Patent No.: US 6,496,043 B1
(45) Date of Patent: Dec. 17, 2002

(54) METHOD AND APPARATUS FOR MEASURING THE PHASE OF CAPTURED READ DATA

(75) Inventors: Robert W. Moss, Longmont, CO (US); Peter Korger, Frederick, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/020,327

(22) Filed: Dec. 13, 2001

(51) Int. Cl.[7] .............................................. G01R 25/00
(52) U.S. Cl. ......................................... 327/12; 327/163
(58) Field of Search ................................. 327/141, 162, 327/163, 3, 7, 12; 375/354, 375

Primary Examiner—Kenneth B. Wells

(74) Attorney, Agent, or Firm—Westman, Champlin & Kelly

(57) ABSTRACT

A phase measurement circuit includes first and second complementary clock strobe inputs, a local clock input and a sample clock output. A programmable delay line is coupled between the local clock input and the sample clock output and has a plurality of propagation delay settings. First and second toggle circuits are clocked by the first and second clock strobe inputs, respectively, and each has a toggle output that changes state when clocked by the respective first or second clock strobe input. A capture latch circuit has first and second data inputs coupled to the toggle outputs of the first and second toggle circuits, respectively, has first and second capture outputs, and is clocked by the sample clock output. A synchronizer circuit has first and second data inputs coupled to the first and second capture outputs, respectively, has first and second synchronized capture outputs, and is clocked by the local clock input.

15 Claims, 3 Drawing Sheets

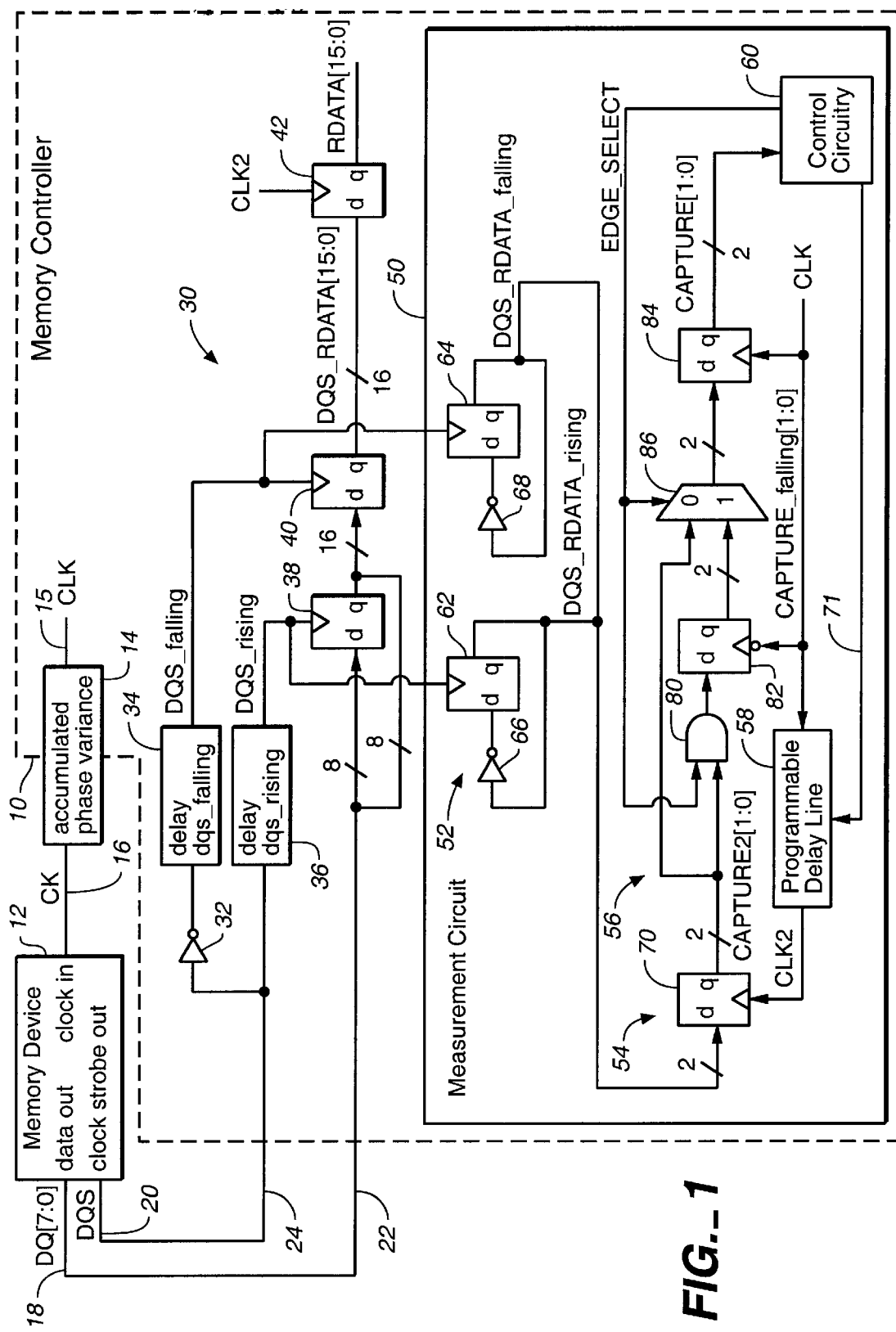
FIG._1

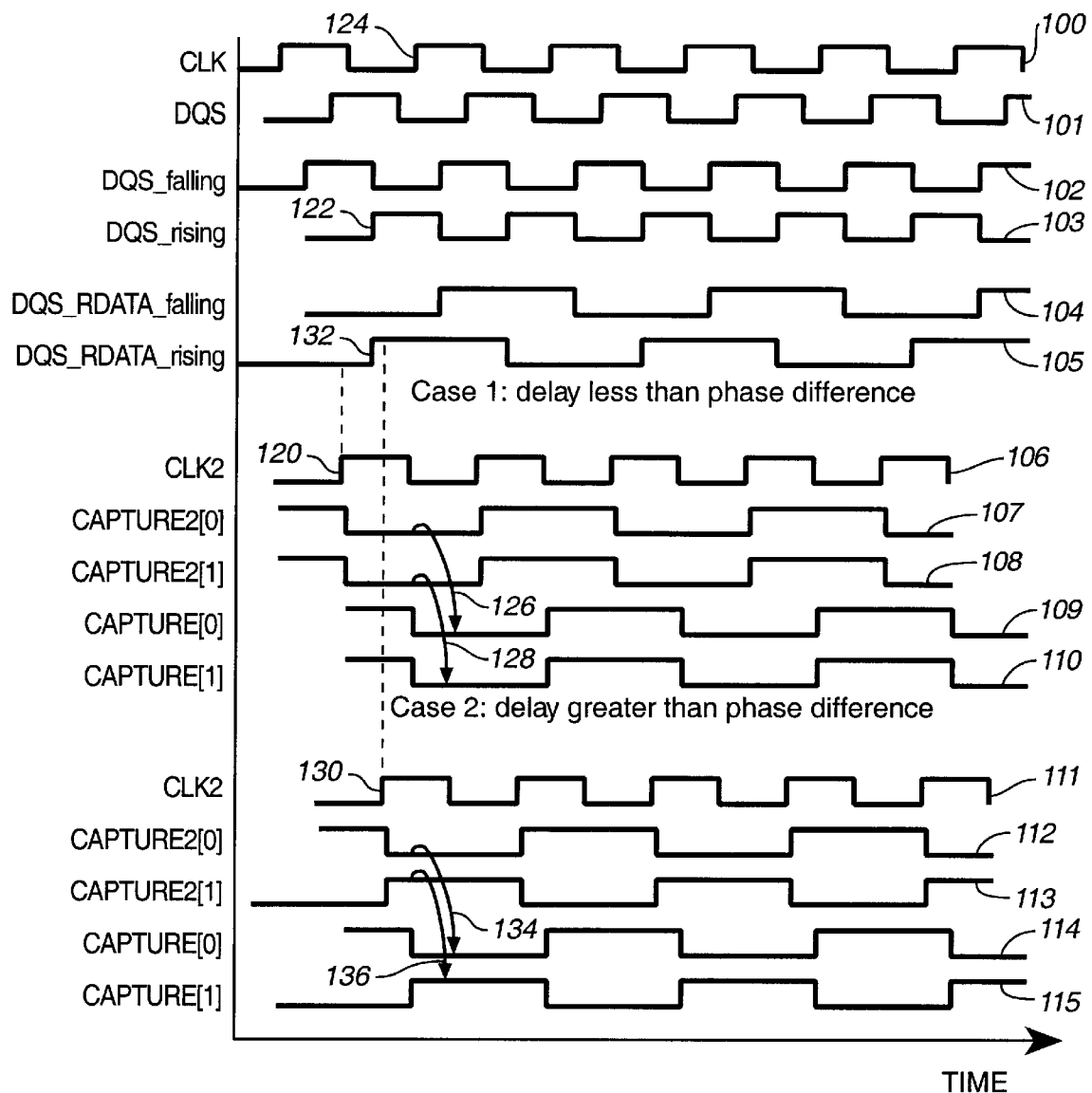
FIG._2

```
for "programmable delay line" from minimum to maximum delay do
200  {
    read the value of CAPTURE [1:0]
    if (CAPTURE[1] exclusive-or CAPTURE[0]) = 0 then
201    {
202        increment "programmable delay line" by the next delay increment
       }
    else
       {
203       record the value in the "programmable delay line" as the phase difference
          exit the test
       }
  }
```
FIG._3
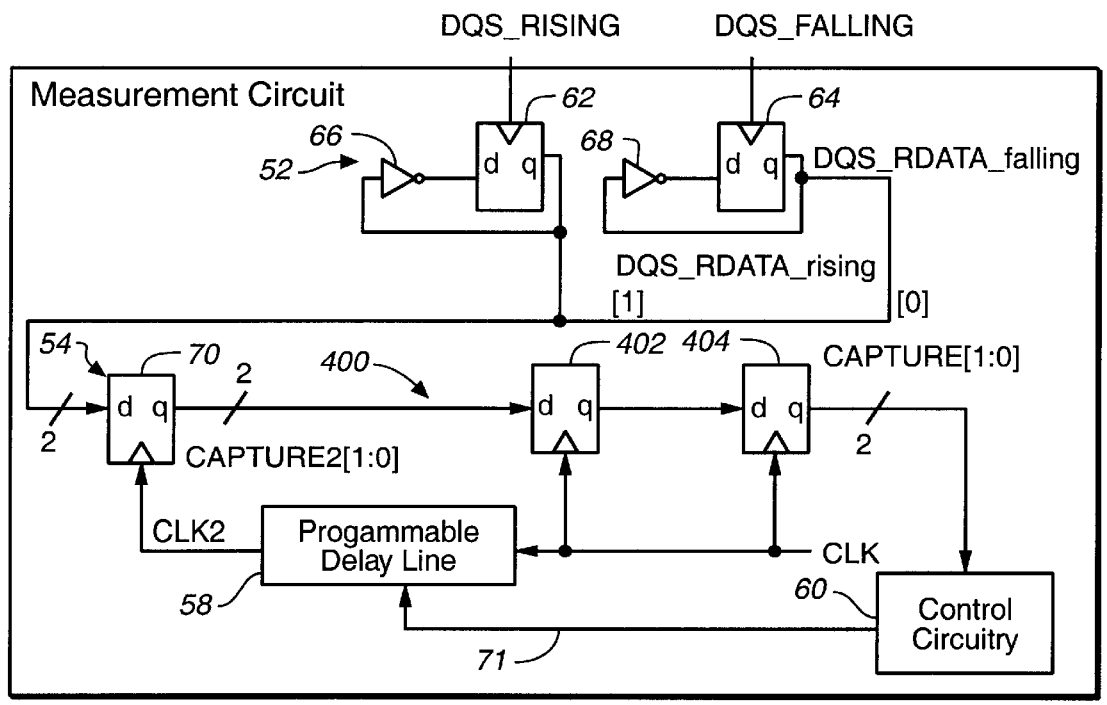
FIG._4

METHOD AND APPARATUS FOR MEASURING THE PHASE OF CAPTURED READ DATA

FIELD OF THE INVENTION

The present invention relates to semiconductor integrated circuits and more particularly to synchronizing read data from a memory device with a memory controller's clock signal.

BACKGROUND OF THE INVENTION

Certain types of memory devices generate a clock strobe signal having edges that are aligned with changes in the read data. A double data rate (DDR) dynamic random access memory (DRAM) transfers data on each rising and falling edge of the clock strobe signal. A DDR DRAM therefore transfers two data words per clock cycle.

A memory controller is often used to coordinate the transfer of data to and from a memory device, such as a DDR DRAM. The memory controller provides a local clock signal to the memory device for synchronizing read and write operations. The clock strobe signal generated by the memory device with the read data has predefined phase constraints with respect to the local clock signal provided by the memory controller. The memory controller uses the clock strobe signal for determining when the read data is valid and can therefore be latched. The times at which the read data is latched are preferably synchronized relative to the clock strobe signal so as to latch the read data in the middle of the valid data window.

Due to varying propagation delays from the memory controller's local clock signal and the clock strobe signal that is received from the memory device, the phase relationship between the captured read data and the local clock signal can change from one device to the next and can change over time. These changes in phase alignment can be caused by input/output (I/O) pad delay variations, power supply fluctuations, process variations, temperature variations and variations in the clock input to data clock strobe output characteristics of the memory device. In certain cases these changes can be large enough to cause the captured read data to cross a metastable region with respect to the memory controller's clock.

Due to these and other factors, accurate synchronization of the captured read data to the memory controller's clock requires the phase relationship between the data output clock strobe signal and the memory controller's clock to be known. Currently, there is no known method or system for measuring and correcting for changes in this phase relationship. Improved memory controller circuits are therefore desired that are capable of measuring the phase relationship between a memory controller's clock and captured read data from a memory device, where the data is aligned with respect to a delayed clock strobe signal that originates from the memory device.

SUMMARY OF THE INVENTION

One embodiment of the present invention is directed to a phase measurement circuit which includes first and second complementary clock strobe inputs, a local clock input and a sample clock output. A programmable delay line is coupled between the local clock input and the sample clock output and has a plurality of propagation delay settings. First and second toggle circuits are clocked by the first and second clock strobe inputs, respectively, and each has a toggle output that changes state when clocked by the respective first or second clock strobe input. A capture latch circuit has first and second data inputs coupled to the toggle outputs of the first and second toggle circuits, respectively, has first and second capture outputs, and is clocked by the sample clock output. A synchronizer circuit has first and second data inputs coupled to the first and second capture outputs, respectively, has first and second synchronized capture outputs, and is clocked by the local clock input.

Another embodiment of the present invention is directed to a method of measuring a phase difference between a sample clock signal and captured data read from a memory device. The data is aligned with respect to a clock strobe signal originating from the memory device, which has constraints with respect to a local clock signal supplied to the memory device. The method includes: (a) delaying the local clock signal with a programmable delay line to produce the sample clock signal, wherein the programmable delay line has a plurality of programmable delay settings; (b) toggling a first logic bit between a first logic state and a second, different logic state with each change of the clock strobe signal from the first logic state to the second logic state; (c) toggling a second logic bit between the first and second logic states with each change of an inverse of the clock strobe signal from the first logic state to the second logic state; (d) capturing the states of the first and second logic bits as a function of the sample clock signal to produce first and second captured logic states; (e) synchronizing the first and second captured logic states to the local clock signal to produce synchronized, first and second captured logic states; and (f) measuring the phase difference as a function of the synchronized, first and second captured logic states.

Yet another embodiment of the present invention is directed to an apparatus for measuring a phase difference between a sample clock signal and captured data read from a memory device. The data is aligned with respect to a clock strobe signal originating from the memory device, which has constraints with respect to a local clock signal supplied to the memory device. The apparatus includes a programmable delay line having a plurality of programmable delay settings for delaying the local clock signal to produce the sample clock signal. A first toggle circuit toggles a first logic bit between a first logic state and a second, different logic state with each change of the clock strobe signal from the first logic state to the second logic state. A second toggle circuit toggles a second logic bit between the first and second logic states with each change of an inverse of the clock strobe signal from the first logic state to the second logic state. A logic state capture circuit captures the states of the first and second logic bits as a function of the sample clock signal to produce first and second captured logic states. A synchronizing circuit synchronizes the first and second captured logic states to the local clock signal to produce synchronized, first and second captured logic states. A measurement circuit measures the phase difference as a function of the synchronized, first and second captured logic states.

BRIEF DESCRIPTION OF THE DRAWINGS

FIG. 1 is a schematic diagram of a memory controller coupled to a memory device according to one embodiment of the present invention.

FIG. 2 is a waveform diagram illustrating various waveforms produced by the circuit shown in FIG. 1 under selected operating conditions.

FIG. 3 is a diagram illustrating an algorithm for detecting the phase difference according to one embodiment of the present invention.

FIG. 4 is a schematic diagram of a phase measurement circuit according to an alternative embodiment of the present invention.

DETAILED DESCRIPTION OF ILLUSTRATIVE EMBODIMENTS

FIG. 1 is a schematic diagram of a memory controller 10 coupled to a memory device 12 according to one embodiment of the present invention. Memory controller 10 has an internal local clock signal CLK, which is used for synchronizing various functions within the memory controller including the capture of data received from memory device 12 and for synchronizing read and write operations within memory device 12 through clock output 15.

In the example shown in FIG. 1, memory device 12 is a double data rate (DDR) dynamic random access memory (DRAM) having a clock input 16 labeled "CK", an 8-bit data output 18 labeled "DQ[7:0]" and a data clock strobe output 20 labeled "DQS". Clock input 16 is coupled to clock output 15 of memory controller 15 for receiving the memory controller's local clock signal CLK. The clock signal "CK" received at clock input 16 is related to memory controller clock CLK but has an accumulated phase variance 14 based on initial conditions such as process variations, PC board characteristics, etc. In addition, the phase difference can vary over time due to power supply fluctuations and variations in voltage and temperature.

When performing a read operation, memory device 12 generates a data clock strobe signal DQS on clock strobe output 20 which has a specified phase relationship to the input clock signal CK and provides an 8-bit data work DQ[7:0] on a data output 18 which is aligned with DQS. In the case of a DDR memory device, the data on data output 18 changes on both the rising and falling edges of DQS.

Data output 18 and data clock strobe output 20 are coupled to data input 22 and clock strobe input 24, respectively, of memory controller 10. Inputs 22 and 24 are coupled to a data capture circuit 30 within memory controller 10 for capturing the data words (DQ[7:0]) provided by memory device 12. Data capture circuit 30 includes inverter 32, delay elements 34 and 36 and latches 38, 40 and 42. In one embodiment, latches 38, 40 and 42 include D-type flip-flops which latch data on the rising edges of the clock signals applied to the latches. Other types of latches can be used in other alternative embodiments.

The latch times are preferably set at approximately the center of the windows during which DQ[7:0] is valid. Therefore, latches 38 and 40 are clocked with delayed versions of DQS such that they capture data at approximately ¼ clock period from the rising and falling edges, respectively, of DQS. With this configuration, two data words are captured during each cycle of DQS.

Clock input 24 is coupled to the clock input of latch 38 through delay element 36. Delay element 36 generates a delayed clock strobe signal DQS_RISING, which has a rising edge that is delayed by approximately ¼ clock period from the rising edge of DQS. Clock input 24 is also coupled to the clock input of latch 40, through inverter 32 and delay element 34. Inverter 32 and delay element 34 generate an inverted, delayed clock strobe signal DQS_FALLING, which has a rising edge that is delayed by approximately ¼ clock period from the falling edge of DQS.

In the embodiment shown in FIG. 1, latch 38 is an 8-bit latch formed of an array of eight D-type flip-flops. The data inputs of latch 38 are coupled to data input 22 for receiving the 8-bit data words DQ[7:0] from memory device 12. On each rising edge of DQS_RISING (the delayed rising edge of DQS) latch 38 latches the data word on DQ[7:0] that was provided by memory device 12 with the rising edge of DQS.

Latch 40 is a 16-bit latch formed of an array of sixteen D-type-flip-flops. A first set of the data inputs to latch 40 are coupled to data input 22 or receiving the 8-bit data words DQ[7:0] from memory device 12. A second set of the data inputs to latch 40 are coupled to the 8-bit data output of latch 38. On each rising edge of DQS_FALLING (the delayed falling edge of DQS), latch 40 latches the 8-bit data word DQ[7:0] that was provided by memory device 12 with the falling edge of DQS and the 8-bit data word DQ[7:0] that was latched by latch 38 (with the rising edge of DQS). Latch 40 has a 16-bit data output labeled DQS_RDATA[15:0], which reflects the two captured data words read from memory device 12 with each cycle of DQS.

DQS_RDATA[15:0] on the rising edge of sample clock signal CLK2. CLK2 is derived from memory controller clock CLK and has a phase alignment relative to DQS that is selected to sample DQS_RDATA[15:0] at the center of the valid data window while taking into account a measure of the accumulated phase difference between CLK and DQS and propagation delays through latches 38 and 40.

This phase difference is measured by phase measurement circuit 50. Phase measurement circuit 50 can be incorporated into memory controller 10 or provided as a separate circuit element. Phase measurement circuit 50 includes toggle circuit 52, logic state capture circuit 54, synchronizer 56, programmable delay line 58 and control circuitry 60. Toggle circuit 52 includes latches 62 and 64 and inverters 66 and 68. Latch 62 is a D-type-flip-flop which has a clock input coupled to DQS_RISING, a data input coupled to the output of inverter 66 and a data output coupled to the input of inverter 66. Similarly, latch 64 is a D-type flip-flop which has a clock input coupled to DQS_FALLING, a data input coupled to the output of inverter 68 and a data output coupled to the input of inverter 68.

The data output of latch 62 provides a first logic bit, DQS_RDATA_RISING, which changes from a first binary logic state to a second, different binary logic state on each rising edge of DQS_RISING. The data output of latch 64 provides a second logic bit, DQS_RDATA_FALLING, which changes from a first binary logic state to a second, different binary logic state on each rising edge of DQS_FALLING. Since only one of the logic bits $DQS_{13}$ RDATA_RISING and DQS_RDATA_FALLING changes state at any given time, at least one of the two signal is guaranteed to be stable when they are captured by logic state capture circuit 54. Other types of toggle circuits can also be used with the present invention.

Logic state capture circuit 54 includes a 2-bit capture latch 70 (formed by D-type flip-flops, for example) having data inputs coupled to DQS_RDATA_RISING and DQS_RDATA_FALLING, respectively. Capture latch 70 has its clock input coupled to sample clock signal CLK2. On each rising edge of CLK2, capture latch 70 captures the states on DQS_RDATA_RISING and DQS_RDATA_FALLING and provides these captured states to the data outputs of the latch. The captured logic stated are labeled CAPTURE2[1:0] in FIG. 1.

Sample clock signal CLK2 is generated at the output of programmable delay line 58, which as an input coupled to memory controller clock CLK. Programmable delay line 58 has a plurality of propagation delay settings that are programmable through delay control input 71, which is coupled to control circuitry 60. In one embodiment, programmable delay line 58 has a propagation delay from its input to its output that can be varied from zero to one clock period of CLK.

Synchronizer circuit 56 synchronizes the captured logic states CAPTURE2[1:0] to memory controller clock signal CLK. The synchronized, captured logic states, labeled CAPTURE[1:0], are then provided to control circuitry 60. Synchronizer circuit 56 includes logic AND gate circuit 80, latch circuits 82 and 84 and multiplexer 86, which are each two bits wide. The captured logic states CAPTURE2[1:0] are coupled to a first set of inputs to AND gate circuit 80 and a first set of data inputs to multiplexer 86. A second set of inputs to AND gate circuit 80 and a select input to multiplexer 86 are coupled to edge select output EDGE_SELECT from control circuitry 60. AND gate circuit 80 gates each bit of CAPTURE2[1:0] independently with EDGE_SELECT. The 2-bit wide output of AND gate circuit 80 is coupled to the data inputs of latch 82, which is clocked by the inverse (the falling edge) of memory controller clock CLK. The outputs of latch 82 are coupled to a second set of data inputs to multiplexer 86. The 2-bit wide data output CAPTURE$_{13}$ FALLING[1:0] of multiplexer 70 is coupled to the data inputs of latch 84, which is clocked by the rising edge of CLK. The data outputs of latch 84, labeled CAPTURE[1:0], are coupled to control circuitry 60.

Control circuitry 60 sets the state of EDGE_SELECT each time control circuitry 60 programs the delay through programmable delay line 58. In one embodiment, control circuitry 60 sets EDGE_SELECT to "1" when the rising edge of CLK2 is closely aligned to rising edge of CLK (such as when delay line 58 has a delay that is greater than 75 percent of the CLK clock period). In this state, CAPTURE2[1:0] is latched with the falling edge of CLK (rather than the rising edge) by latch 82, and then passed through multiplexer 86 to latch 84 which latches the synchronized states on the next riding edge of CLK.

Control circuitry 60 sets EDGE_SELECT to "0" when the rising edge of CLK2 is not closely aligned to rising edge of CLK (such as when delay line 58 has a delay that is less than 75 percent of the CLK clock period). In this state, CAPTURE2[1:0] is passed directly through multiplexer 86 to latch 84, which latches the captured states on the next riding edge of CLK. When EDGE_SELECT is "0", AND gate circuit 80 resets the inputs to latch 82 to avoid potential metastability problems. The use of two separate latches 82 and 84 avoids potential set-up and hold time issues by synchronizing CAPTURE2[21:0] with either the rising or falling edges of CLK. In any case, the synchronized, captured logic states are provided to control circuitry 60. Control circuitry 60 can be implemented in hardware, software or a combination of both hardware and software. For example, control circuit 60 can be implemented as a state machine or a programmed computer.

During operation, control circuitry 60 progressively sweeps the delay through programmable delay line 58 over a range of different delay settings while monitoring the synchronized, captured logic states CAPTURE[1:0]. For each delay setting, control circuitry 60 records the states of CAPTURE[1:0] and compares each pair of logic states using an exclusive-or function to detect the delay setting at which CLK2 is aligned with DQS_RISING and DQS_FALLING. At this delay setting, the exclusive-or result changes state as described in more detail in FIG. 2. The delay setting at which the exclusive-or result changes state is a function of the accumulated phase difference between CLK and DQS and can therefore be used to select a delay setting at which CLK2 samples DQS$_{13}$ RDATA[15:0] in the center of the valid data window.

FIG. 2 is a waveform diagram which illustrates various waveforms 100–115 generated within the circuit shown in FIG. 1 as a function of time. Waveform 100 represents the local memory controller clock signal CLK. Waveform 101 represents the data clock strobe signal DQS, which is generated by memory device 12. Waveforms 102 and 103 represent DQS_FALLING and DQS_RISING, which are delayed from DQS by ¼ clock period. DQS_FALLING is inverted with respect to DQS_RISING. Waveforms 104 and 105 represent the toggled logic states of DQS_RDATA_FALLING and DQS_RDATA_RISING, respectively. These waveforms are initially reset to zero. On each rising edge of DQS_FALLING, DQS_RDATA_FALLING changes state. Similarly, on each rising edge of DQS_RISING, DQS_RDATA_RISING changes state.

Waveforms 106–110 illustrate an example when the delay setting in programmable delay line 58 is less than the phase difference between CLK and DQS_RISING/DQS_RISING, at 122. The capture states CAPTURE2[1:0] that are latched with the rising edge of CLK2 are therefore both zero. The captured states CAPTURE2[1:0] are then latched by latch 84 at the next rising edge 124 of CLK to produce CAPTURE[1:0], as shown by waveforms 109 and 110 and arrows 126 and 128. Since the rising edge of CLK2 always occurs before the rising edge of DQS_RISING, capture latch 70 (shown in FIG. 1) captures DQS_RDATA_FALLING and DQS_RDATA_RISING before DQS_RDATA_RISING changes state. Therefore, the captured values of DQS_RDATA_FALLING and DQS_RDATA_RISING always have the same state as shown by waveforms 107 and 108. As a result, the synchronized captured states CAPTURE[1:0]also have the same state as shown by waveforms 109 and 110.

Waveforms 111–115 show the case where the delay through programmable delay line 58 (shown in FIG. 1) is greater than the phase difference between CLK and DQS_RISING/DQS$_{13}$ FALLING. In this case, the rising edge 130 of CLK2, as shown in waveform 111, occurs after the rising edge 122 of DQS_RISING. Thus, DQS_RDATA_RISING has already changed states relative to DQS_RDATA_FALLING when the states are captured with CLK2 by capture latch 70. The captured states CAPTURE2[1:0] are therefore different from one another as shown by waveforms 112 and 113. Again, CAPTURE2[1:0] are synchronized with the next rising edge of CLK, as shown by waveforms 114 and 115 and arrows 134 and 136. The synchronized captured states CAPTURE[1:0] are therefore also different from one another as shown by waveforms 114 and 115.

In the case shown by waveforms 106–110, the exclusive-or of CAPTURE[0] and CAPTURE[1] is a logic "0". In the case shown by waveforms 111–115, the exclusive-or of CAPTURE[0] and CAPTURE[1] is a logic "1". As the delay through programmable delay line 58 is swept across the range of delay settings, the exclusive-or of CAPTURE[0] and CAPTURE [1] changes state as the programmable delay transitions from a delay less than the phase difference to a delay greater than the phase difference. At this transition, the delay in programmable delay line 58 is a function of the phase difference between the data clock strobe signal DQS provided by memory device 12 and the memory controller clock CLK.

In one embodiment, control circuitry 60 incrementally increases (or decreases) the delay through programmable delay line 58 through an entire range of delay settings while recording the values of CAPTURE[1:0] at each delay setting. Control circuitry 60 then calculates the exclusive-or of each set of captured states to determine the delay setting at which the exclusive-or result changes states. This delay setting can then be used to calculate a desired delay for sampling DQS_RDATA[15:0] such that the rising edge of CLK2 is substantially centered in the window during which DQS_RDATA[15:0] is stable.

Even though the captured versions CAPTURE[0] and CAPTURE[1] can vary from sample to sample, the exclusive-or of them changes only when the delay in programmable delay line 58 is moved across the phase difference between CLK and DQS_RISING/DQS_FALLING. By sweeping programmable delay line 58 across its entire range, the phase difference can be detected.

In an alternative embodiment, memory controller 10 further includes an exclusive-or gate coupled between the data output of capture latch 84 and control circuitry 60. The exclusive-or gate takes the exclusive-or of CAPTURE[1] and CAPTURE [0] and provides the result to control circuitry 60. Control circuitry 60 records (or alternatively monitors) the exclusive-or result for each delay setting of delay line 58. The delay setting at which the exclusive-or result changes state corresponds to the phase difference.

FIG. 3 is a diagram illustrating an algorithm for detecting the phase difference according to one embodiment of the present invention. For each setting of the programmable delay line, from minimum to maximum delay, the value of CAPTURE[1:0] is read at step 200. At step 201, if the exclusive-or of CAPTURE[1] and CAPTURE[0] is zero, then the programmable delay line is incremented to the next delay increment at step 202. If not, the value in the programmable delay line is recorded as being representative of the phase difference at step 203. This process is repeated for each value of the programmable delay line. The algorithm can be performed during initial calibration of the system or periodically during its operation to take into account operational variances such as changes in temperature, power supply fluctuations and changes in memory device characteristics.

FIG. 4 is a schematic diagram illustrating a phase measurement circuit according to alternative embodiment of the present invention. The same reference numerals are used in FIG. 4 as were used in FIG. 1 for the same or similar elements. In this embodiment, a double synchronizer 400 is used to synchronize CAPTURE2[1:0] to the memory controller clock CLK. Double synchronizer 400 includes D-type flip-flops 402 and 404, which are each two bits wide. Each flip-flop is clocked by the memory controller clock CLK, with the output of flip-flop 402 being coupled to the input of flip-flop 404. Again, capture latch 70 captures the states of toggle circuit 52, and double synchronization circuit 400 synchronizes the changing of those states to memory controller clock CLK. The synchronized, captured states CAPTURE[1:0] are provided to control circuitry 60. This embodiment is more simple to implement than the embodiment shown in FIG. 1 but has the disadvantage of adding a clock cycle to the synchronization process. Also, synchronizer 400 is not configured to avoid stability issues that arise when the rising edge of CLK2is closely aligned with the rising edge of CLK. In yet another alternative embodiment, the synchronizer can include only a single flip-flop that is controlled by memory controller clock CLK. Other synchronizer circuits can also be used.

Although the present invention has been described with reference to preferred embodiments, workers skilled in the art will recognize that changes may be made in form and detail without departing from the spirit and scope of the invention. For example, the phase measurement circuit can be used with any memory device (or register) where the read data is aligned with respect to a clock strobe that originates from the memory device and the clock strobe has phase constraints with respect to a clock supplied to the memory device. It can also be used whenever the phase relationship between registered data and a clock needs to be determined, provided the registered data was captured with a clock derived from the clock that the phase difference is being measured from. The measurement circuit can be used as part of an overall memory controller or as discrete logic associated with a device, such as register, that latches data read rom such a memory device. In addition, the term "coupled" used in the specification and the claims can include a direct connection and an a connection through one or more intermediate components.

What is claimed is:

1. A phase measurement circuit comprising:
   first and second complementary clock strobe inputs;
   a local clock input;
   a sample clock output;
   a programmable delay coupled between the local clock input and
      the sample clock output and having a plurality of propagation delay settings;
   first and second toggle circuits which are clocked by the first and
      second clock strobe inputs, respectively, and each have a toggle output that changes state when clocked by the respective first or second clock strobe input;
   a capture latch circuit which is clocked by the sample clock
      output, has first and second data inputs coupled to the toggle outputs of the first and second toggle circuits, respectively, and has first and second capture outputs; and
   a synchronizer circuit which is clocked by the local clock input
      and has first and second data inputs coupled to the first and second capture outputs, respectively, and has first and second synchronized capture outputs.

2. The phase measurement circuit of claim 1 wherein:
   the first toggle circuit comprises a first inverter and a first flip-flop
      which has a clock input coupled to the first clock strobe input, a data input, and a data output which is coupled to the data input through the first inverter; and
   the second toggle circuit comprises a second inverter and a second
      flip-flop which has a clock input coupled to the second clock strobe input, a data input, and a data output which is coupled to the data input through the second inverter.

3. The phase measurement circuit of claim 1 wherein the capture latch circuit comprises a first and second flip-flops which are coupled in parallel with one another between the first and second data inputs, respectively, of the capture latch circuit and the first and second capture outputs, respectively, and are clocked by the sample clock output.

4. The phase measurement circuit of claim 1 wherein the synchronizer circuit comprises, for each of the capture outputs;
   a first flip-flop which is coupled between a respective one of the first and second data inputs of the synchronizer circuit and a respective one of the first and second synchronized capture outputs and which is clocked by the local clock input.

5. The phase measurement circuit of claim 4 wherein the synchronizer circuit further comprises, for each of the capture outputs;

a second flip-flop coupled in series with the first flip-flop and which is clocked by an inverse of the local clock input.

6. The phase measurement circuit of claim 5 wherein the synchronizer circuit further comprises, for each of the capture outputs;

a clock edge select node;

and AND gate having a first data input coupled to respective one of the first and second data inputs of the synchronizer circuit, a second data input coupled to the clock edge select node, and a data output coupled to a data input of the second flip-flop;

a multiplexer having a first data input coupled to the respective first or second data input of the synchronizer circuit, a second data input coupled to a data output of the second flip-flop, a select input coupled to the clock edge select node and a data output coupled to a data input of the first flip-flop; and means for setting a logic state on the clock edge select node as a function of propagation delay through the programmable delay.

7. The phase measurement circuit of claim 1 and further comprising means for changing propagation delay through the programmable delay from one of the propagation delay settings to another of the propagation delay settings and for performing an exclusive-or function on the first and second synchronized capture outputs for each of the propagation delay settings.

8. The phase measurement circuit of claim 7 wherein the means for changing comprises means for progressively varying the propagation delay through the programmable delay and thereafter setting the propagation delay through the programmable delay based on the propagation delay setting at which the exclusive-or function changes state.

9. The phase measurement circuit of claim 1 and further comprising:

a common clock strobe input;

a first delay element coupled between the common clock strobe input and the first clock strobe input;

an inverter; and a second delay element coupled in series with the inverter, between the common clock strobe input and the second clock strobe input.

10. A method of measuring a phase difference between a sample clock signal and captured data read from a memory device that is aligned with respect to a clock strobe signal originating from the memory device, which has constraints with respect to a local clock signal supplied to the memory device, the method comprising:

(a) delaying the local clock signal with a programmable delay line to produce the sample clock signal, wherein the programmable delay line has a plurality of programmable delay settings;

(b) toggling a first logic bit between a first logic state and a second, different logic state with each change of the clock strobe signal from the first logic state to the second logic state;

(c) toggling a second logic bit between the first and second logic states with each change of an inverse of the clock strobe signal from the first logic state to the second logic state;

(d) capturing the states of the first and second logic bits as a function of the sample clock signal to produce first and second captured logic states;

(e) synchronizing the first and second captured logic states to the local clock signal to produce synchronized, first and second captured logic states; and (f) measuring the phase difference as a function of the synchronized, first and second captured logic states.

11. The method of claim 10 and further comprising:

(g) setting propagation delay through the programmable delay line to a selected one of the delay settings;

(h) performing steps (a) through (e) at the selected delay setting; and (i) repeating steps (g) and (h) for each of the plurality of delay settings.

12. The method of claim 11 wherein step (f) comprises measuring the phase difference as a function of the synchronized, first and second captured logic states at each of the plurality of delay settings.

13. The method of claim 12 wherein step (f) further comprises measuring the phase difference based on an exclusive-or of the first synchronized captured logic state and the second synchronized captured logic state for each of the plurality of delay settings.

14. The method of claim 10 and further comprising:

(g) progressively varying propagation delay through the programmable delay line, from one of the delay settings to the next; and (h) performing steps (b) through (e) for each of the delay settings; and (i) wherein step (f) comprises measuring the phase difference based on the delay setting at which an exclusive-or of the corresponding first and second synchronized captured logic states changes state.

15. An apparatus for measuring a phase difference between a sample clock signal and captured data read from a memory device that is aligned with respect to a clock strobe signal originating from the memory device, which has constraints with respect to a local clock signal supplied to the memory device, the apparatus comprising:

(a) a programmable delay line having a plurality of programmable delay settings for delaying the local clock signal to produce the sample clock signal;

(b) means for toggling a first logic bit between a first logic state and a second, different logic state with each change of the clock strobe signal from the first logic state to the second logic state;

(c) means for toggling a second logic bit between the first and second logic states with each change of an inverse of the clock strobe signal from the first logic state to the second logic state;

(d) means for capturing the states of the first and second logic bits as a function of the sample clock signal to produce first and second captured logic states;

(e) means for synchronizing the first and second captured logic states to the local clock signal to product synchronized, first and second captured logic states; and (f) means for measuring the phase difference as a function of the synchronized, first and second captured logic states.

* * * * *